United States Patent
Thomas et al.

(10) Patent No.: US 11,894,039 B2
(45) Date of Patent: *Feb. 6, 2024

(54) FFT-DRAM

(71) Applicant: NIF/T, LLC, Reno, NV (US)

(72) Inventors: Mammen Thomas, Hercules, CA (US); Robert J. Strain, San Jose, CA (US)

(73) Assignee: NIF/T, LLC, Reno, NV (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/846,985

(22) Filed: Jun. 22, 2022

(65) Prior Publication Data

US 2022/0319567 A1 Oct. 6, 2022

Related U.S. Application Data

(63) Continuation of application No. 17/180,454, filed on Feb. 19, 2021, now Pat. No. 11,373,696.

(51) Int. Cl.
*G11C 11/402* (2006.01)
*G11C 11/4074* (2006.01)
(Continued)

(52) U.S. Cl.
CPC ...... *G11C 11/4023* (2013.01); *G11C 11/4074* (2013.01); *G11C 11/4097* (2013.01); *H01L 27/0924* (2013.01); *H10B 12/37* (2023.02)

(58) Field of Classification Search
CPC ............ G11C 11/4023; G11C 11/4074; G11C 11/4097; H10B 12/37; H01L 27/0924
(Continued)

(56) References Cited

U.S. PATENT DOCUMENTS

| 5,298,452 A | 3/1994 | Meyerson |
| 5,314,547 A | 5/1994 | Heremans |

(Continued)

FOREIGN PATENT DOCUMENTS

| EP | 0936676 A2 | 8/1999 |
| WO | 2009053327 A1 | 4/2009 |
| WO | 2013027092 A1 | 2/2013 |

OTHER PUBLICATIONS

Aoki, M , et al., "0.1 μm CMOS Devices Using Low-Impurity-Channel Transistors (LICT)", International Electron Devices Meeting, 1990. IEDM '90 Technical Digest, (Dec. 9-12, 1990), pp. 9.8.1 to 9.8.3.

(Continued)

*Primary Examiner* — Huan Hoang
(74) *Attorney, Agent, or Firm* — Womble Bond Dickinson (US) LLP

(57) ABSTRACT

A flat field transistor (FFT) based dynamic random-access memory (DRAM) (FFT-DRAM) is disclosed. The FFT-DRAM comprises an epitaxially grown source region comprising a source extension and an epitaxial source over and in contact with the source extension. The epitaxially grown source region is over a surface of a semiconductor substrate. The FFT-DRAM further comprises a trench capacitor structurally integrated into the epitaxially grown source region. The trench capacitor has a first terminal formed by the epitaxially grown source region and a second terminal being a conductive material filling one or more trenches of the trench capacitor. The second terminal is connected to a ground terminal or a fixed voltage terminal.

20 Claims, 9 Drawing Sheets

(51) Int. Cl.
H01L 27/092 (2006.01)
G11C 11/4097 (2006.01)
H10B 12/00 (2023.01)

(58) Field of Classification Search
USPC .................................................. 365/149
See application file for complete search history.

(56) References Cited

U.S. PATENT DOCUMENTS

| | | |
|---|---|---|
| 5,316,958 A | 5/1994 | Meyerson |
| 5,710,450 A | 1/1998 | Chau et al. |
| 6,124,627 A | 9/2000 | Rodder et al. |
| 6,180,978 B1 | 1/2001 | Chatterjee et al. |
| 6,188,114 B1 | 2/2001 | Gardner et al. |
| 6,254,676 B1 | 7/2001 | Yang et al. |
| 6,479,866 B1 | 11/2002 | Xiang |
| 6,566,734 B2 | 5/2003 | Sugihara et al. |
| 6,627,488 B2 | 9/2003 | Lee |
| 6,627,502 B1 | 9/2003 | Cho |
| 6,630,710 B1 | 10/2003 | Augusto |
| 6,667,200 B2 | 12/2003 | Sohn et al. |
| 6,746,924 B1 | 6/2004 | Lee et al. |
| 6,812,157 B1 | 11/2004 | Gadgil |
| 7,023,068 B1 | 4/2006 | Hopper et al. |
| 7,045,407 B2 | 5/2006 | Keating et al. |
| 7,227,224 B2 | 6/2007 | Ko et al. |
| 7,459,752 B2 | 12/2008 | Doris et al. |
| 7,569,456 B2 | 8/2009 | Ko et al. |
| 7,589,347 B2 | 9/2009 | Nash et al. |
| 7,732,285 B2 | 6/2010 | Sell et al. |
| 7,906,413 B2 | 3/2011 | Cardone et al. |
| 8,012,820 B2 | 9/2011 | Majumdar et al. |
| 8,273,617 B2 | 9/2012 | Thompson et al. |
| 8,313,999 B2 | 11/2012 | Cappellani et al. |
| 8,450,165 B2 | 5/2013 | Bohr |
| 8,486,778 B2 | 7/2013 | Haran et al. |
| 8,614,486 B2 | 12/2013 | Haran et al. |
| 8,748,986 B1 | 6/2014 | Shifren et al. |
| 8,847,315 B2 | 9/2014 | Yang et al. |
| 9,397,003 B1 | 7/2016 | Niimi et al. |
| 11,373,696 B1* | 6/2022 | Thomas ............. G11C 11/4097 |
| 2001/0009292 A1 | 7/2001 | Nishinohara |
| 2002/0001930 A1 | 1/2002 | Lee |
| 2002/0028546 A1 | 3/2002 | Shin et al. |
| 2002/0029372 A1 | 3/2002 | Lee |
| 2002/0037619 A1 | 3/2002 | Sugihara et al. |
| 2003/0211681 A1 | 11/2003 | Hanafi et al. |
| 2003/0214000 A1 | 11/2003 | Jang et al. |
| 2004/0080003 A1 | 4/2004 | Lee |
| 2004/0169221 A1 | 9/2004 | Ko et al. |
| 2004/0201063 A1 | 10/2004 | Fukuda |
| 2004/0206980 A1 | 10/2004 | Cheong et al. |
| 2005/0095796 A1 | 5/2005 | Van Bentum et al. |
| 2006/0022270 A1 | 2/2006 | Boyd et al. |
| 2006/0046399 A1 | 3/2006 | Lindert et al. |
| 2006/0113605 A1 | 6/2006 | Currie |
| 2006/0157797 A1 | 7/2006 | Tateshita |
| 2007/0049022 A1 | 3/2007 | Chen et al. |
| 2007/0166926 A1 | 7/2007 | Ko et al. |
| 2008/0001237 A1 | 1/2008 | Chang et al. |
| 2008/0017887 A1 | 1/2008 | Nagata et al. |
| 2008/0242037 A1 | 10/2008 | Sell et al. |
| 2008/0283906 A1 | 11/2008 | Bohr |
| 2009/0050984 A1 | 2/2009 | Balasubramanian |
| 2009/0207649 A1 | 8/2009 | Tang et al. |
| 2009/0321820 A1 | 12/2009 | Yamakawa |
| 2009/0321849 A1 | 12/2009 | Miyamura et al. |
| 2010/0237433 A1 | 9/2010 | Zampardi et al. |
| 2011/0073961 A1 | 3/2011 | Dennard et al. |
| 2011/0074498 A1 | 3/2011 | Thompson et al. |
| 2011/0147842 A1 | 6/2011 | Cappellani et al. |
| 2011/0165739 A1 | 7/2011 | Majumdar et al. |
| 2011/0212583 A1 | 9/2011 | Neudeck |
| 2011/0230017 A1 | 9/2011 | Khater et al. |
| 2011/0233688 A1 | 9/2011 | Ren et al. |
| 2011/0260220 A1 | 10/2011 | Chi et al. |
| 2012/0058610 A1 | 3/2012 | Ookoshi et al. |
| 2012/0061759 A1 | 3/2012 | Cheng et al. |
| 2012/0104470 A1 | 5/2012 | Ponoth et al. |
| 2012/0205728 A1 | 8/2012 | Yin et al. |
| 2013/0001706 A1 | 1/2013 | Haran et al. |
| 2013/0015509 A1 | 1/2013 | Haran et al. |
| 2013/0015512 A1 | 1/2013 | Haran et al. |
| 2013/0015525 A1 | 1/2013 | Cheng et al. |
| 2013/0032859 A1 | 2/2013 | Pei et al. |
| 2013/0032876 A1 | 2/2013 | Cheng et al. |
| 2013/0168776 A1 | 7/2013 | Liang et al. |
| 2013/0249021 A1 | 9/2013 | Asenov et al. |
| 2014/0070333 A1 | 3/2014 | Cheng et al. |
| 2014/0159124 A1 | 6/2014 | Doris et al. |
| 2014/0264612 A1 | 9/2014 | Cheng et al. |
| 2014/0264632 A1 | 9/2014 | Richter et al. |
| 2014/0299919 A1 | 10/2014 | Yin et al. |
| 2014/0339638 A1 | 11/2014 | Cheng et al. |
| 2014/0353717 A1 | 12/2014 | Loubet et al. |
| 2015/0087120 A1 | 3/2015 | Adam et al. |
| 2015/0108576 A1 | 4/2015 | Barge et al. |
| 2015/0115374 A1 | 4/2015 | Yin et al. |
| 2015/0194505 A1 | 7/2015 | Asenov et al. |
| 2015/0236117 A1 | 8/2015 | Kapoor et al. |
| 2015/0270343 A1 | 9/2015 | Cheng et al. |
| 2015/0372102 A1 | 12/2015 | Usami |
| 2016/0035843 A1 | 2/2016 | Vinet et al. |
| 2016/0148933 A1 | 5/2016 | Cheng et al. |
| 2016/0181252 A1 | 6/2016 | Arnold |
| 2016/0343856 A1 | 11/2016 | Leobandung et al. |
| 2017/0040449 A1 | 2/2017 | Asenov |
| 2017/0365606 A1 | 12/2017 | Aquilino et al. |

OTHER PUBLICATIONS

Asenov, Asen, "Random Dopant Induced Threshold Voltage Lowering and Fluctuations in Sub-0.1 µm MOSFET's: A 3-D "Atomistic" Simulation Study", IEEE Transactions on Electron Devices, vol. 45, No. 12, (Dec. 1998), pp. 2505-2513.

Asenov, Asen, "Random Dopant Threshold Voltage Fluctuations in 50nm Epitaxial Channel MOSFETs: A 3D Atomistic' Simulation Study", ESSDERC '98: 28th Conference on European Solid-State Devices, Bordeax, France, (Sep. 8-10, 1998), pp. 300-303.

Asenov, Asen, et al., "Suppression of Random Dopant-Induced Threshold Voltage Fluctuations in Sub-0.1-µm MOSFET's with Epitaxial and δ-Doped Channels", IEEE Transactions on Electron Devices, vol. 46, No. 8, (Aug. 1999), pp. 1718-1724.

Bruel, M., "Silicon on insulator material technology", Electronics Letters, vol. 31, No. 14, (Jul. 6, 1995), pp. 1201-1202.

Cheng, K., et al., "Extremely Thin SOI (ETSOI) CMOS with Record Low Variability for Low Power System-on-Chip Applications", 2009 IEEE International Electron Devices Meeting (IEDM), (Dec. 7-9, 2009), pp. 3.2.1-3.2.4.

Clark, L. T., et al., "A Highly Integrated 65-nm SoC Process with Enhanced Power/Performance of Digital and Analog Circuits", International Electron Devices Meeting, IEDM 2012, (Dec. 10-13, 2012), pp. 14.4.1 to 14.4.4.

Colinge, Jean-Pierre, "Hot-Electron Effects in Silicon-On-Insulator n-Channel MOSFET's", IEEE Transactions on Electron Devices, vol. ED-34, No. 10, (Oct. 1987), pp. 2173-2177.

Courtland, Rachel, "Start-up Seeks New Life for Planar Transistors, SuVolta is pursuing precision doping in its bid to compete with 3-D transistor technology", IEEE spectrum tech alert, (Dec. 8, 2011), 3 pp. total.

Frank, Martin M., "High-k / Metal Gate Innovations Enabling Continued CMOS Scaling", 2011 Proceedings of the ESSCIRC, (Sep. 12-16, 2011), pp. 50-58.

Fu, Y., et al., "Subband structure and ionized impurity scattering of the two dimensional electron gas in δdoped field effect transistor", Journal of Applied Physics, vol. 78, No. 5, (Sep. 1, 1995), pp. 3504-3510.

Fujita, K., et al., "Advanced Channel Engineering Achieving Aggressive Reduction of VT Variation for Ultra-Low-Power Appli-

(56) References Cited

OTHER PUBLICATIONS cations", Electron Devices Meeting (IEDM), 2011 IEEE International, (Dec. 2011), pp. 32.3.1-32.3.4.

Hokazono, Akira, et al., "25-nm Gate Length nMOSFET With Steep Channel Profiles Utilizing Carbon-Doped Silicon Layers (A P-Type Dopant Confinement Layer)", IEEE Transactions on Electron Devices, vol. 58, No. 5, (May 2011), pp. 1302-1310.

Kuhn, Kelin J., et al., "Process Technology Variation", IEEE Transactions on Election Devices, vol. 58, No. 8, (Aug. 2011), pp. 2197-2208.

Kuhn, Kelin J., "Reducing Variation in Advanced Logic Technologies: Approaches to Process and Design for Manufacturability of Nanoscale CMOS", 2007 IEEE International Electron Devices Meeting (IEDM), (Dec. 10-12, 2007), pp. 471-474.

Maleville, Christophe, "Extending planar device roadmap beyond node 20nm through ultra thin body technology", 2011 International Symposium on VLSI Technology, Systems and Applications (VLSI-TSA), (Apr. 25-27, 2011), pp. 1-4.

Markov, Stanislov, et al., "Statistical Variability in Fully Depleted SOI MOSFETs Due to Random Dopant Fluctuations in the Source and Drain Extensions", IEEE Electron Device Letters, vol. 33, No. 3, (Mar. 2012), pp. 315-317.

Meyer, J. E., et al., "High Performance, Low Power CMOS Memories Using Silicon-On-Sapphire Technology", 1971 International Electron Devices Meeting, (1971), p. 44.

Noda, Kenji, et al., "A 0.1-μm Delta-Doped MOSFET Fabricated with Post-Low-Energy Implanting Selective Epitaxy", IEEE Transactions on Electron Devices, vol. 45, No. 4, (Apr. 1998), pp. 809-813.

Packan, P., et al., "High Performance 32nm Logic Technology Featuring 2nd Generation High-k + Metal Gate Transistors", 2009 IEEE International Electronic Devices Meeting (IEDM), (2009), pp. 28.4.1-28.4.4.

Pawlak, B. J., et al., "Effect of amorphization and carbon co-doping on activation and diffusion of boron in silicon", Applied Physics Letters, 89, 062110, (2006), pp. 062110-1 to 062110-3.

Pawlak, B. J., et al., "Suppression of phosphorus diffusion by carbon co-implantation", Applied Physics Letters, 89, 062102, (2006), pp. 062102-1 to 062102-3.

Roy, G., et al., "Random dopant fluctuation resistant 'bulk' MOSFETs with epitaxial delta doped channels", Ultimate Integration in Silicon (ULIS) Conference, Glasgow, Scotland, (2007), 4 pp. total.

Saraswat, Krishna C., "Shallow Junctions", downloaded from http://web.stanford.edu/class/ee311/NOTES/ShallowJunctions.pdf, (Apr. 10, 2006), pp. 1-20.

Sze, et al. "Physics of Semiconductor Devices", John Wiley & Sons, Inc., (2007), pp. 28-32, 312-313, 343-344.

Takeuchi, Kiyoshi, et al., "Channel Engineering for the Reduction of Random-Dopant-Placement-Induced Threshold Voltage Fluctuation", 1997 International Electron Devices Meeting (IEDM), Technical Digest, (Dec. 7-10, 1997), pp. 841-844.

Verweijo, J. F., et al., "Dielectric breakdown I: a review of oxide breakdown", Microelectronics Journal 27.7, Elsevier, (Oct. 1996), pp. 611-622.

Young, K. Konrad, "Short-Channel Effect in Fully Depleted SOI MOSFET's", IEEE Transactions on Electron Devices, vol. 36, No. 2, (Feb. 1989), pp. 399-402.

\* cited by examiner

Table 1 – Abbreviated Process Flow for FFT Device

Fig. 4

| Seq | Steps |
|---|---|
| 1 | Choose substrate. |
| 2 | Establish shallow trench isolation and wells. (p-well for n-channel and n-well for p-channel) |
| 3 | Grow or deposit initial gate oxide and gate dielectric. |
| 4 | Deposit gate metal with controlled work function. |
| 5 | Deposit amorphous silicon and pattern gate. (Si, metal and gate dielectric.) |
| 6 | Deposit thin sidewall dielectric. |
| 7 | Clean dielectric from substrate |
| 8 | Grow selective epi S/D extensions. (n+ for n-channel and p+ for p-channel) |
| 9 | Conformally deposit spacer dielectric. (typically, $Si_3N_4$ or similar) |
| 10 | Anisotropic spacer etch to clear the dielectric from the top of the S/D extension. |
| 11 | Grow selective S/D epi region on the S/D extension. (n++ for n-channel and p++ for p-channel) |
| 12 | Deposit ILD and planarize with CMP |
| 13 | Contact Mask, Contact Etch, form Silicide in contact, Contact Fill, CMP |
| 14 | Metallization and M1 definition |
| 15 | IMD, Via mask, etch (Etch stop on Trench silicide), via fill, CMP |
| 16 | Metallization and M2 definition |
| 17 | Continue multilayer metallization processing |

Table 2 – Abbreviated Integrated Process Flow for FFT-DRAM Cell

| Seq | Steps |
|---|---|
| 1 | Choose substrate. |
| 2 | Establish shallow trench isolation and wells. (p-well for n-channel and n-well for p-channel) |
| 3 | Grow or deposit initial gate oxide and gate dielectric. |
| 4 | Deposit gate metal with controlled work function. |
| 5 | Deposit amorphous silicon and pattern gate. (Si, metal and dielectric) |
| 6 | Deposit thin sidewall dielectric. |
| 7 | Clean oxide from substrate. |
| 8 | Grow selective epi S/D extensions(n+ for n-channel and p+ for p-channel) |
| 9 | Conformally deposit spacer dielectric. (typically, $Si_3N_4$ or similar) |
| 10 | Anisotropic spacer etch to clear the dielectric from the top of the S/D extension. |
| 11 | Grow selective S/D epi region on the S/D extension(n++ for n-channel and p++ for p-channel) |
| 12 | Deposit 1st layer of ILD (ILD-Part 1) and planarize with CMP. |
| 13 | Deposit hard mask, mask and etch trenches/holes in the epi source of the FFT-DRAM; remove the hard mask. |
| 14 | Deposit capacitor dielectric into the etched trench(es) or hole(s). |
| 15 | Fill capacitor recesses with conductive material. |
| 16 | Planarize by CMP or mask and etch to ILD-Part 1 to remove excess refill material and open the trench contacts |
| 17 | Create a etch protect layer over trench contacts |
| 18 | Deposit a $2^{nd}$ layer (ILD-Part 2) over the ILD-Part 1. |
| 19 | Contact Mask, Contact Etch, form Silicide in contact, Contact Fill, CMP |
| 20 | Metallization and M1 definition |
| 21 | IMD, Via mask, etch (Etch stop on Trench silicide), via fill, CMP |
| 22 | Metallization and M2 definition |
| 23 | Continue multi-layer metallization processing |

Fig. 5

FFT-DRAM

CROSS-REFERENCE TO RELATED APPLICATIONS

This application is a continuation of U.S. patent application Ser. No. 17/180,454 filed on Feb. 19, 2021, the disclosure of which is incorporated herein by reference.

TECHNICAL FIELD

Embodiments of the present disclosure generally relate to the structure and manufacturing of dynamic random access memory (DRAM). More specifically, embodiments of the disclosure relate to a DRAM integrated with Flat Field Transistor (FFT) technology.

BACKGROUND

The currently available high performance technologies for fabrication of MOS VLSI around and below 28 nm that provide good transistor performance, such as FinFET technology, are highly complex and difficult to manufacture at reasonable cost. Further, these technologies do not lend themselves for easy integration with dynamic random access memory (DRAM) cells embedded in integrated circuit chips. Any such integration makes the processing of these integrated circuits (ICs) or systems-on-chip (SOCs) very complex and expensive, putting such chips out of contention for consumer internet-of-things (IoT) applications. This problem has resulted in the use of separate DRAM chips rather than integrating memory cells into the IoT ICs/SOC, resulting in the need to use chip-to-chip interconnect and advanced packaging. Multiple chips increase the size of IoT products, slow down their operating speeds and increase their power consumption. At times, for applications where a small number of DRAM bytes are needed, a full DRAM chip must be attached to the IC/SOC, increasing the cost of the product further.

The rapidly growing IoT applications usually require ICs/SOCs to have some reasonable amounts of easily accessible, low cost, fast memories embedded to avoid violating the cost requirements for consumer applications.

Though the requirement for the embedded DRAM in the IoT segment is growing at a very fast pace, it will be optimum if any DRAM cell and technology proposed is also usable for stand alone DRAM standard product, thereby making it a much more attractive cell and technology because of its wider use.

FIG. 1A is a schematic of a conventional DRAM cell 100A. It comprises a capacitor 102A in series with a pass transistor 101A. The capacitor 102A has one terminal connected to ground 103A. The other terminal of the capacitor 102A is connected through the pass transistor 101A to the bit line 105. The gate of the pass transistor 101A is connected to a word line 104A that controls the ON/OFF condition of the pass transistor 101A.

During a WRITE of the DRAM, the bit line 105A voltage is brought up to a voltage that represents the data to be stored, e.g., a positive voltage representing a data="1" or a zero voltage representing a data="0". A turn-on voltage is applied via the word line 104A to the gate of the pass transistor 101A, thereby turning the pass device 101A ON to charge or discharge the capacitor 102A depending on the data. When the pass transistor 101A is turned off, the charge on the capacitor is retained to represent the data.

During a READ, the word line 104A is used to turn the pass transistor ON and allow the capacitor 102A to connect to the bit line. The charge on the capacitor is now shared with the capacitance of the bit line, the voltage of the bit line stays at a low for a data "0" or increases if the data "1" was written into the capacitor 102A. The charge sharing is in proportion to the ratio between the capacitance of the storage capacitor 102A and the capacitance of the bit line 105A. Hence, it is ideal to have a high-value charge storage capacitor connect with a very low bit line capacitance, allowing for the voltage on the capacitor to be passed on to the bit line.

In the operation of a DRAM involving writing, storing and reading data in the capacitor using the pass transistor, other points to consider are:

1. Using a low leakage pass transistor to reduce loss/gain of charge on the capacitor between a write cycles to reduce need for frequently refreshing the charge, which represents stored data.
2. Using a low Vt pass transistor to improve the charge voltage and discharge voltage from the capacitor. (During the charging of the capacitor, the pass transistor behaves as a source-follower, limiting the ultimate voltage to the gate voltage Vg diminished by the threshold voltage Vt.)
3. Using a high current pass device to speed up the READ and WRITE operations.

All the above requirements impact the writing, reading and retention characteristics of the DRAM, and the writing and reading requirements for the pass transistor are in conflict with the retention requirements for that same device. A chip's ability to satisfy all the requirements is seriously hampered by any uncertainty of the threshold voltages across the array. Hence using a pass transistor with superior leakage characteristics and low statistical threshold variability $\sigma Vt$, particularly when it is integrated with low leakage capacitor, will lead to the integration of a superior DRAM.

What is needed is a pass transistor technology and a storage device technology, having some or all of the characteristics discussed above, that can be manufactured at reasonable cost as a standalone DRAM device, and which can also be easily embedded in a logic or processing integrated circuit (IC).

BRIEF DESCRIPTION OF THE DRAWINGS

The embodiments of the disclosure are illustrated by way of example and not by way of limitation in the figures of the accompanying drawings in which like references indicate similar elements. It should be noted that references to "an" or "one" embodiment of the disclosure in this disclosure are not necessarily to the same embodiment, and they mean at least one. In the drawings:

FIG. 4—is a Table 1 showing an example process flow for fabricating FFT metal gate transistors.

FIG. 5—is a Table 2 showing an example integrated process flow for the FFT-DRAM of FIG. 3B.

DETAILED DESCRIPTION

Figure 1A:
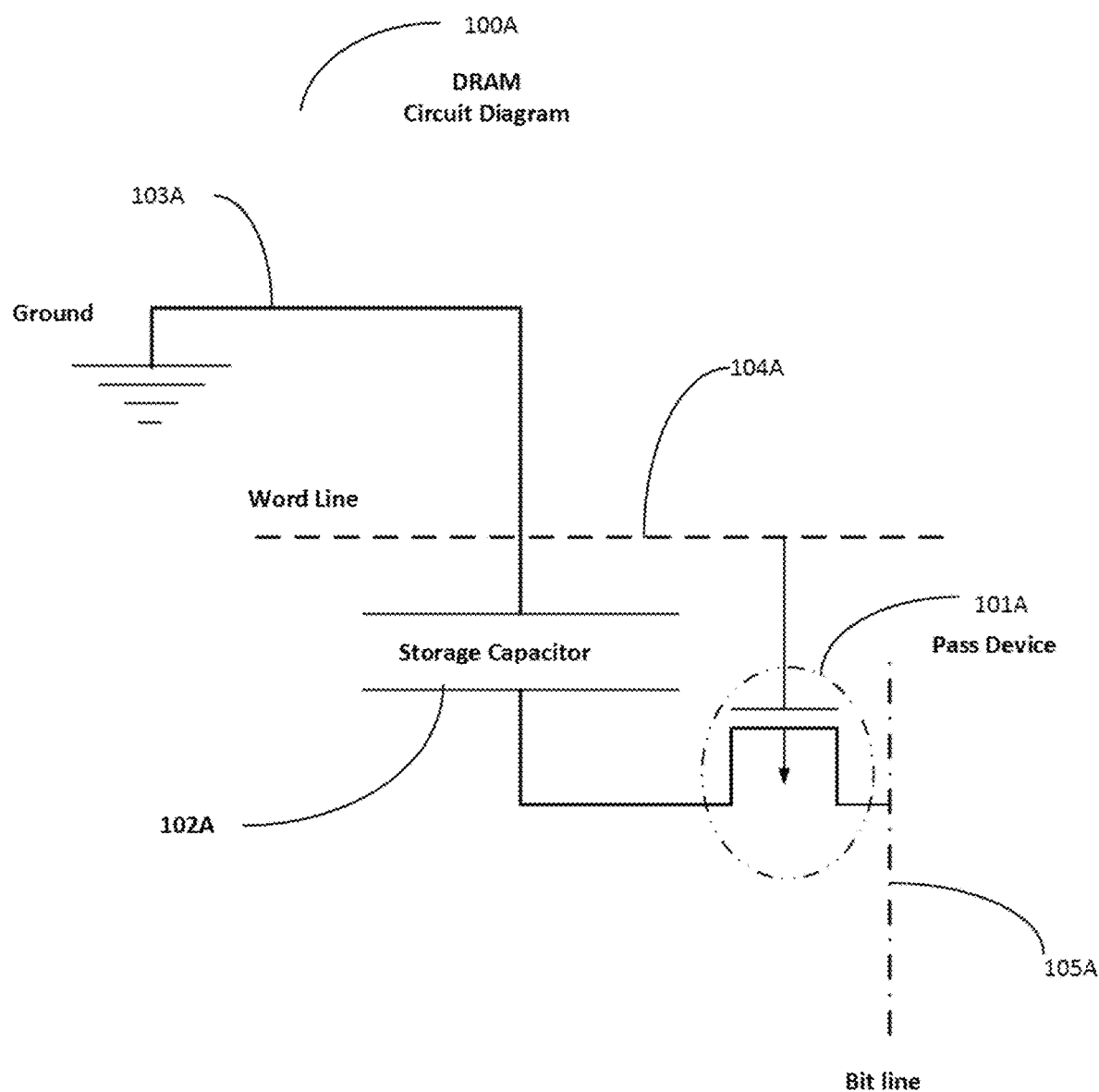
FIG. 1A—is a schematic diagram 100A of a conventional DRAM with pass transistor.

According to a first aspect, a flat field transistor (FFT) based dynamic random-access memory (DRAM) (FFT-DRAM) is disclosed. The FFT-DRAM comprises an epitaxially grown source region comprising a source extension and an epitaxial source over and in contact with the source extension. The epitaxially grown source region is over, but not penetrating in some embodiments, a surface of a semiconductor substrate. The FFT-DRAM further comprises a trench capacitor structurally integrated into the epitaxially grown source region. The word trench as used herein may be extended to any one of several different structures penetrating the epitaxially source structure and/or the substrate. Such structures may have circular cross sections, rectangular cross sections, or cross sections of another shape or form depending on available photolithographic and etching technologies. Further such structures may have generally straight sidewalls, perpendicular to the surface, or they may be tapered or, in the case of a circular cross section, totally or partially conical. The trench capacitor has a first terminal formed by the epitaxially grown source region and a second terminal being a conductive material filling one or more trenches of the trench capacitor. The second terminal is connected to a ground terminal or a fixed voltage terminal. The conductive material filling the trenches is separated from the source region by a dielectric separating the first and second terminals of the trench capacitor. When the FFT-DRAM is turned on, the first terminal of the trench capacitor is connected to a bit line connected to a drain of the FFT-DRAM. When the FFT-DRAM is turned off, the first terminal of the trench capacitor is isolated from the bit line connected to the drain of the FFT-DRAM.

According to a second aspect, an FFT-DRAM device integratable onto a silicon integrated circuit (IC) is disclosed. The FFT-DRAM device comprises a trench capacitor as a storage device. The trench capacitor has at least two terminals comprising a first terminal and a second terminal, isolated from each other by a capacitor dielectric. The FFT-DRAM device further comprises an epitaxial source connected structurally to the first terminal of the trench capacitor. The trench capacitor is implemented through the epitaxial source such that the epitaxial source structurally connecting to form the first terminal of the trench capacitor. The second terminal of the trench capacitor is formed by a conductive layer inside one or more trenches connected to a ground or a fixed voltage source via a metal interconnect. The FFT-DRAM device further comprises an epitaxial drain formed by epitaxial growth over a surface of a substrate and connected to a bit line. The FFT-DRAM device further comprises a gate connected to a word line enabled to turn the FFT-DRAM device on or off by application of a gate voltage.

According to a third aspect, an FFT-DRAM device is disclosed. The FFT-DRAM device comprises a drain extension and a source extension instantiated on a surface of a substrate using low temperature epitaxial deposition on either side of a conductive gate electrode over a gate dielectric. The drain extension and the source extension are in contact with the substrate and the drain extension and source extension are isolated from the conductive gate electrode by a first dielectric. The FFT-DRAM device further comprises a drain deposition over the drain extension using the low temperature epitaxial deposition. The drain deposition is in contact with the drain extension. The FFT-DRAM device further comprises a source deposition over the source extension using the low temperature epitaxial deposition. The source deposition in contact with the source extension. The source deposition and the drain deposition are isolated from the conductive gate electrode by a second dielectric, wherein the second dielectric is thicker than the first dielectric. The source extension and the source deposition over the source extension form a source region of the FFT-DRAM device. The drain extension and the drain deposition over the source extension form a drain region of the FFT-DRAM device. The source region has one or more trenches filled by a conductive material isolated from the source region by a third dielectric and connected to a ground terminal. The trenches have the conductive material forming a first electrode. The third dielectric separates the conductive material from a source region epitaxial material of the source region that forms a second electrode, as a first terminal of a charge storage capacitor. The charge storage capacitor is formed by the conductive material, the third dielectric, and the source region epitaxial material together. The first terminal of the charge storage capacitor is structurally connected to the source region. A channel of the FFT-DRAM device forms a path connecting the first terminal of the charge storage capacitor to a bit line connected to the drain deposition when the FFT-DRAM device is turned on by application of a turn on voltage at the conductive gate electrode. The channel of the FFT-DRAM device is turned off isolating the first terminal of the capacitor from the bit line when the FFT-DRAM device is turned off.

A DRAM integrated with Flat Field Transistor (FFT) device technology and using the features of FFT is proposed. The Flat Field technology is implementable on bulk silicon or silicon-on-insulator substrates. It eliminates the impact of random dopant distributions on the threshold voltage (Vt) and reduces short channel effects in the MOS transistors. Hence the FFT transistors operate at lower supply voltages while maintaining the required noise margins. Tighter control of the Vt of MOS transistors can be used to improve drive currents and reduce leakage. The charge storage capacitor is integrated through the FFT's source, above the surface of the silicon, using etched features, like trenches, holes, or fins to increase storage capacitance.

The DRAM manufacturing processes steps used in the industry today are not easily integratable with the FFT process steps. Herein, the DRAM processing is integrated with the FFT process in the disclosed FFT-DRAM with only a few additional steps.

What is proposed is a technology, device structure and method to implement a FFT-DRAM cell by integrating a charge storage capacitor with the low threshold variance flat field transistor (FFT) device. The FFT, is described in U.S. application Ser. No. 15/226,118 filed on Aug. 2, 2016 having a priority date of Aug. 3, 2015 published as US publication 20170040449, titled: "Reduced Local Threshold Voltage Variation MOSFET Using Multiple Layers of Epi for Improved Device Operation", the disclosure of which is incorporated herein by reference in its entirety. The FFT-DRAM cells disclosed are conceived to be usable in a stand-alone industry standard DRAM chip with the peripheral circuits, read-write circuits and other supporting logic circuits within the chip being implemented using FFT transistor devices. Alternately these FFT-DRAM cells with supporting circuits may be embedded on chip with other logic or processing circuits needed for an application specific IC or SOC for IoT or similar other applications. Such implementations can use FFT devices for other built-in circuits to fully integrate and utilize the advantages provided by the combination of the FFT-DRAM and FFT.

To create an elegant FFT-DRAM structure, a charge storage capacitor is integrated with a pass transistor, in this case an FFT device. For convenience, such pass transistors will be referred to as FFT devices in the balance of this specification. Further, as discussed before, it is important to be able to integrate the "DRAM functionality" into the FFT based CMOS process flow used for IoT without making the processing too complex or expensive. Hence it has been an aim of FFT-DRAM technology development to provide the ability to integrate the FFT and FFT-DRAM in a single semiconductor chip and to allow large FFT-DRAM arrays incorporating FFT-based sense and read/write logic to be manufactured economically. Further, we facilitate commercially and technologically viable, industry standard, FFT-DRAM devices, in addition to the capability to embed the FFT-DRAM devices in application specific ICs and SOCs.

The main advantages of having any integrated DRAM in the ICs/SOCs are access speed, operating power reduction, improved reliability, capability to optimize their implementation to the required density and array architecture for the desired application and for a lower cost of manufacture of final product.

The CMOS Flat-Field Transistor technology (FFT) for realizing transistors at gate dimensions in the range of 28 nm has been proposed for implementation on bulk-silicon, bulk-silicon with epitaxial surface layer or silicon-on-insulator (SOI) substrates. This low-cost CMOS technology, with reduced short-channel effects, low leakage and very low random-dopant-distribution based threshold variations σVt, is ideal for the manufacture of high-performance CMOS transistors. The high performance and low manufacturing cost make this one of the best candidates for IoT applications.

Integrating memory cells, especially dynamic random access memory cells (DRAMs) for embedded applications with the FFT, is advantageous in IoT applications. These embedded DRAMs are ideal for storage of collected data and processed results.

Figure 1B:
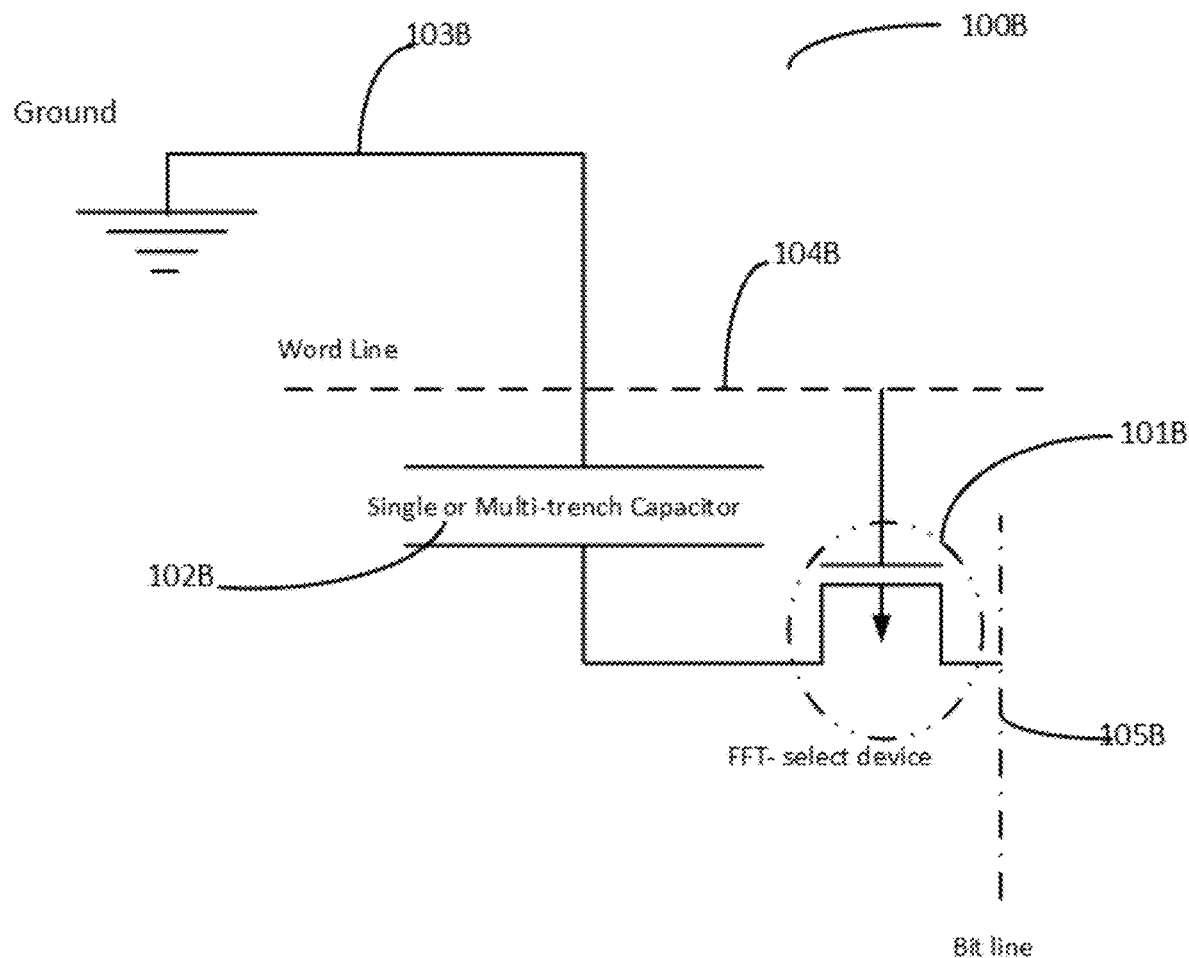
FIG. 1B—is the schematic diagram 100B of DRAM with FFT as pass transistor.
Figure 3A:
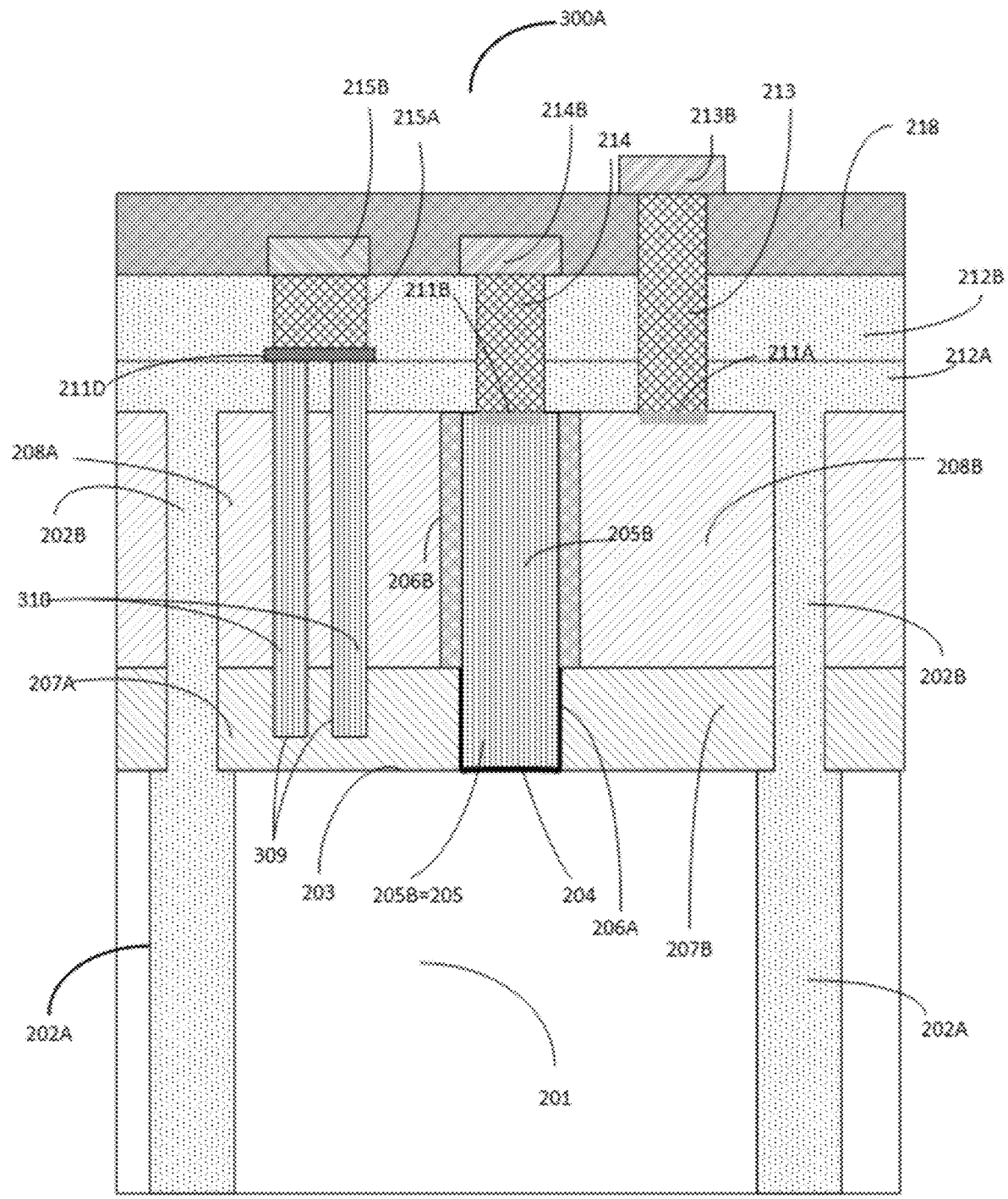
FIG. 3A—is an embodiment 300A of the FFT-DRAM device with amorphous silicon gate.
Figure 3B:
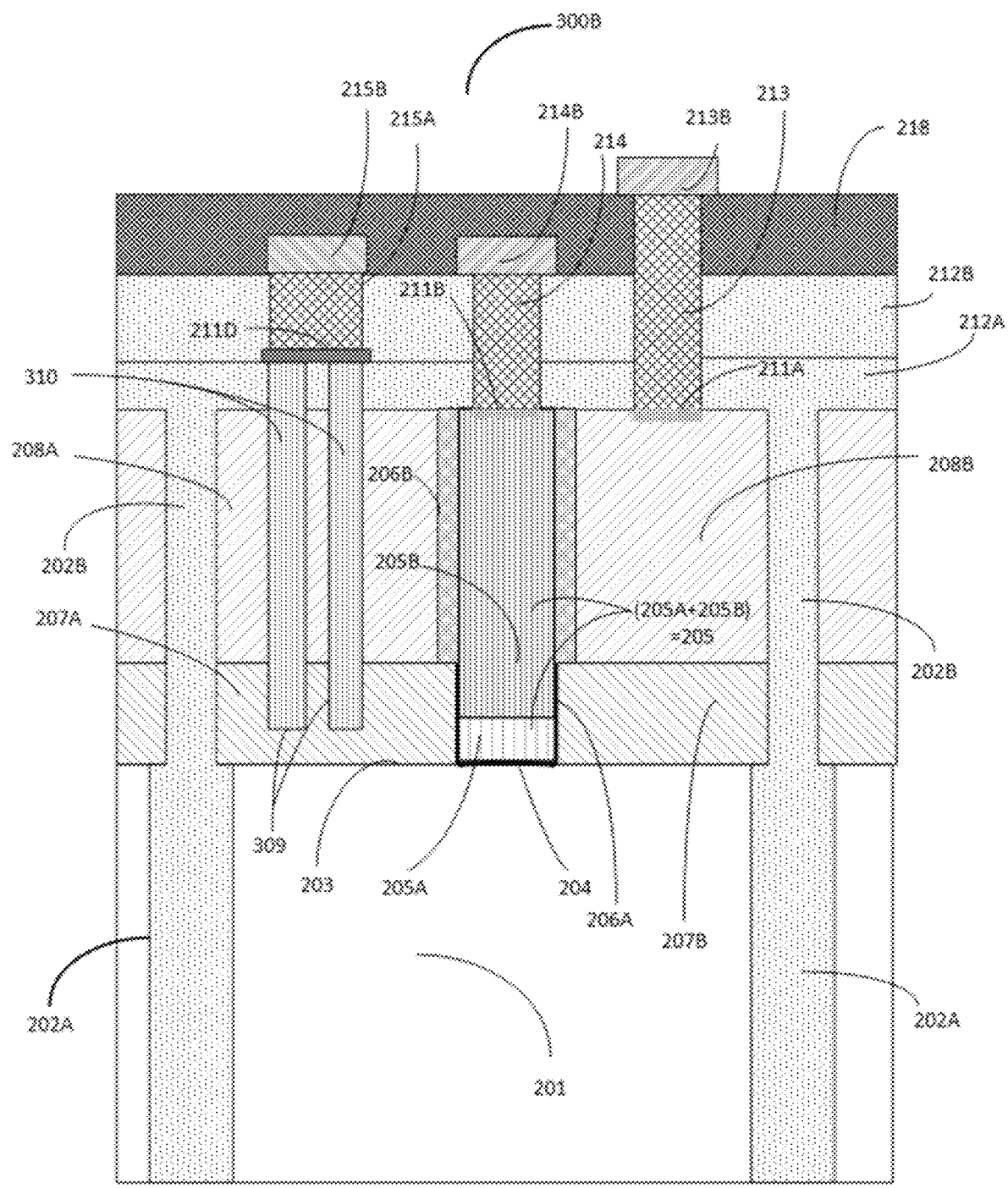
FIG. 3B—is an embodiment 300B of the FFT-DRAM device with metal gate.
Figure 3C:
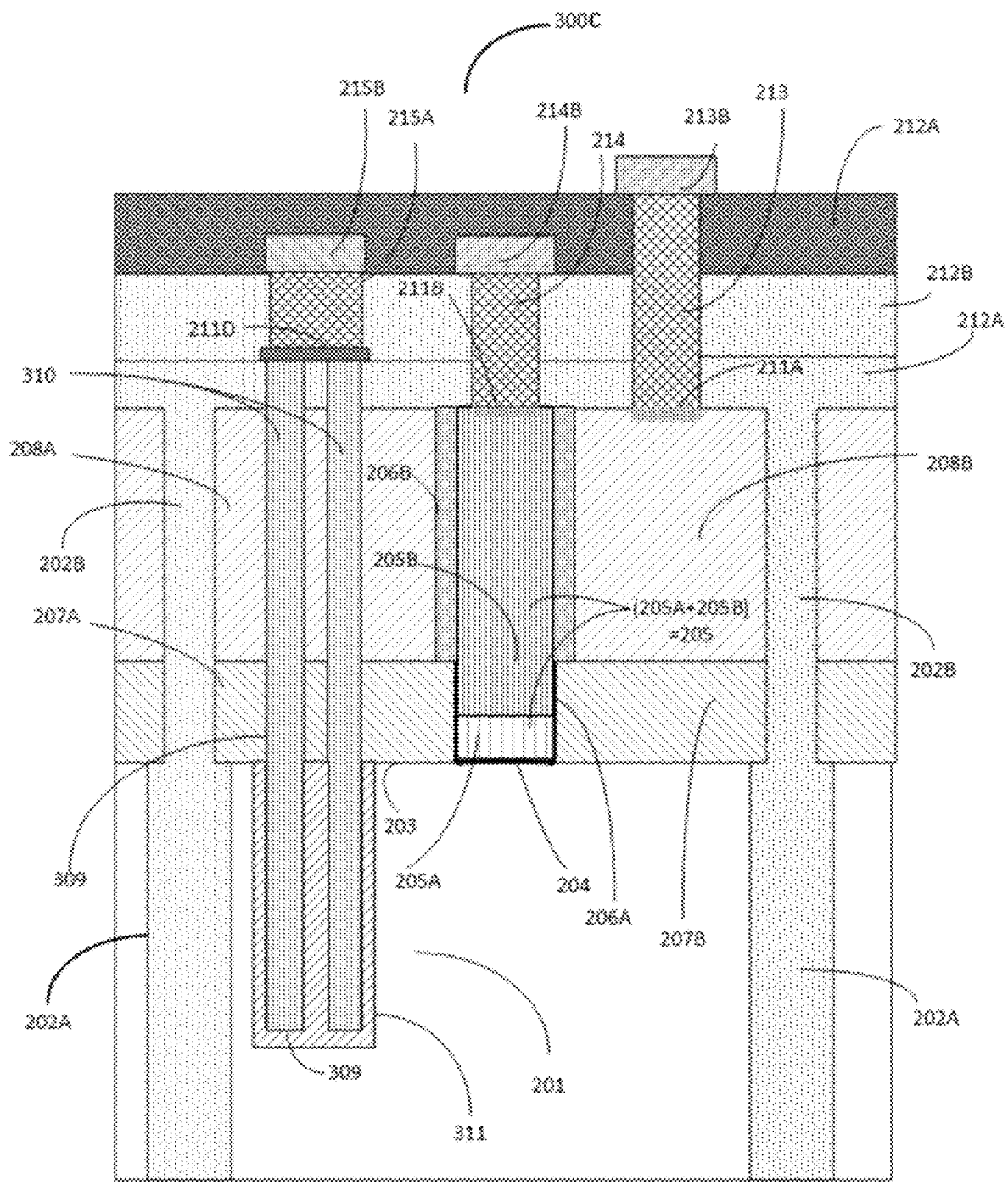
FIG. 3C—is an embodiment 300C of the FFT-DRAM device with the capacitor extended into the substrate.

The FFT-DRAM proposed is a capacitor with a low threshold variance pass transistor that controls the charge transfer to and from the capacitor as shown in FIG. 1B. An FFT-DRAM can be enabled by using the FFT as the pass transistor with a single or multi-trench capacitor, within or through one of the epitaxial S/D regions as shown in FIG. 3A or 3B or 3C. Such an FFT-DRAM can be easily integrated with the FFT device as discussed later. While it is not shown in FIG. 3A, 3B or 3C, a stacked charge storage capacitor could also be used instead of the trench charge storage capacitor in the FFT-DRAM structure.

Figure 2A:
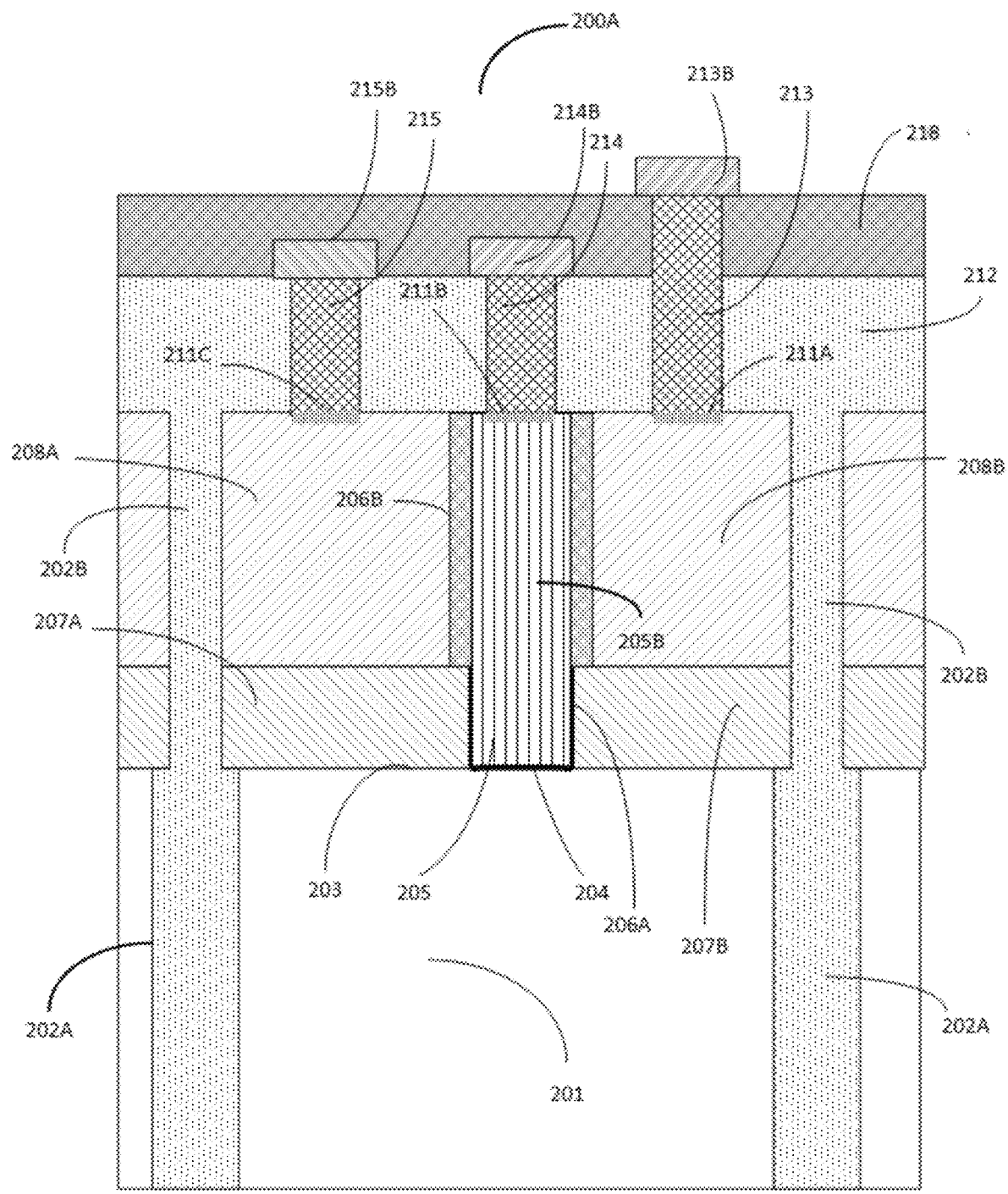
FIG. 2A—is an embodiment 200A of the FFT (N-channel) device structure with an amorphous silicon gate conductor.
Figure 2B:
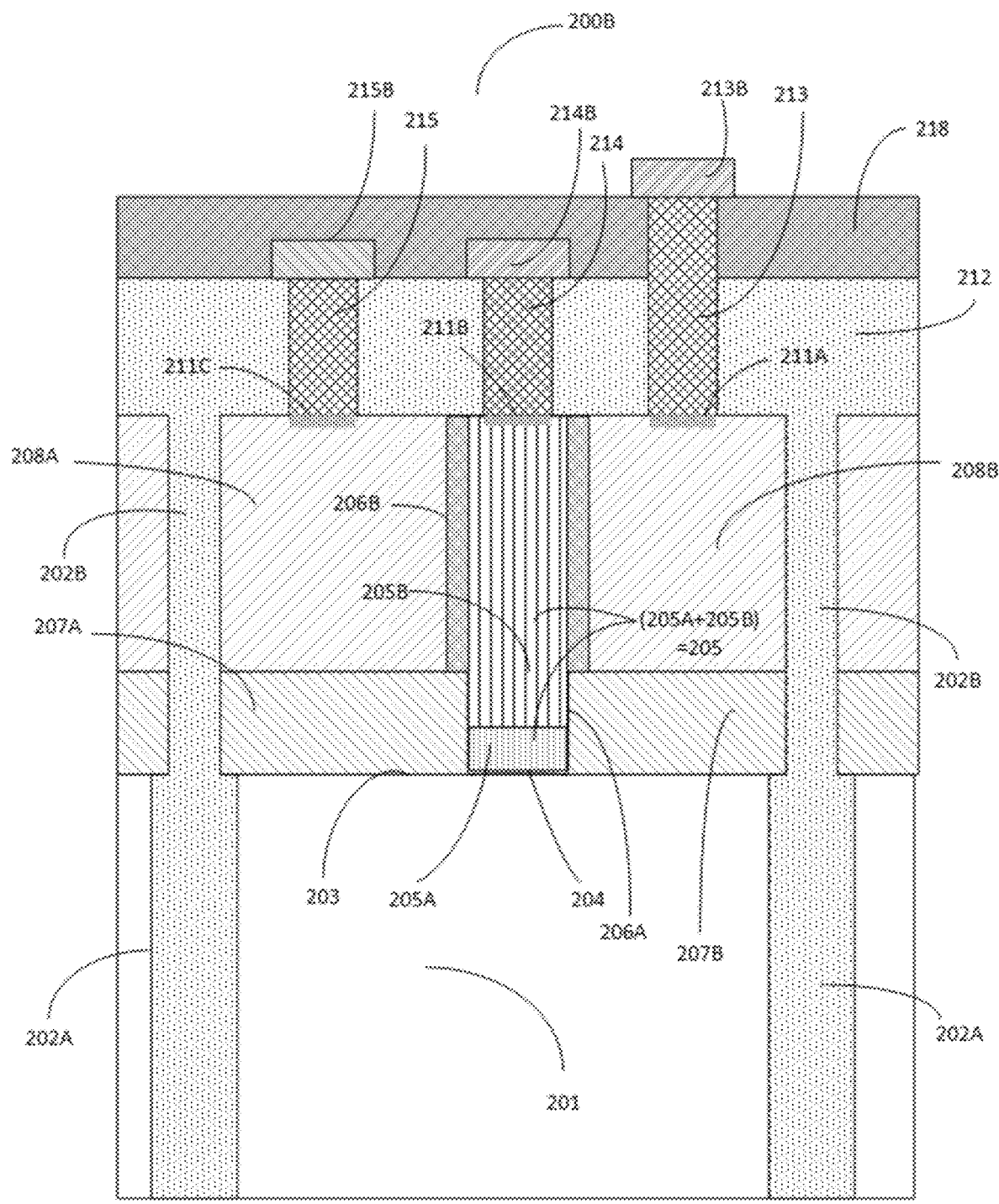
FIG. 2B—is an embodiment 200B of the FFT (N-channel) device structure with metal gate for improved performance.

FIG. 1B shows a circuit diagram 100B of the FFT-DRAM using the FFT as the pass transistor. FIGS. 2A and 2B show embodiments 200A and 200B of the structure of the FFT, and FIGS. 3A, 3B and 3C show embodiments 300A, 300B and 300C of the integrated FFT-DRAM structures, each with a charge storage capacitor integrated into the processing and structure of the FFT to make the FFT-DRAM cell of the current application. Such integration enables the FFT based Integrated circuits (ICs) System on Chip (SOC) implementations to embed FFT-DRAM into the chips with minimum additional steps. As discussed, typical DRAMs are charge storage devices that comprise a capacitor storage device 102B in series with a controllable pass gate 101B, using the FFT as shown in FIG. 1B. While this discussion will refer to the storage capacitor 102B as being connected to ground, the line 103B may be connected to any fixed voltage that might be required to optimize the performance or reliability of the DRAM. By turning on the pass gate 101B by application of a voltage to the word line 104B and applying a digital or data input to the bit line 105B, the digital input data can be stored on the capacitor 102B. It can be read back by again by applying a pass-gate 101B turn-on voltage to the word line 104B, thereby connecting the capacitor to the bit line 105B. This permits the charge stored on the capacitor 102B to be shared by the bit line 104B. A sensing circuit (not shown) coupled to the bit line 105B is used to sense the status of the stored bit as indicated by the charge/voltage on the bit line 105B due to the shared charge.

The Flat Field Transistors shown in FIGS. 2A and 2B and the FFT-DRAM devices shown in FIGS. 3A, 3B and 3C comprise a semiconducting substrate 201, and which may be N or P doped as a doped well depending on whether a P channel FFT device or an N channel FFT device is being utilized. The semiconductor substrate may be a bulk substrate, an epitaxial layer on bulk substrate, or a silicon on insulator (SOI) substrate. The example figures, FIGS. 2A and 2B, both show N-channel FFT structures 200A and 200B built over a P-well in bulk substrate. The substrate has an active region isolated from the surrounding regions by the dielectric isolation 202A as shown. The dielectric isolation shape shown is just an example. The processing needs for isolation are based on the substrate used, and the structure of the isolation that will result is well known and understood by the practitioners of the art of semiconductor manufacturing. Ideally, the isolation process chosen and used is conducive to close packing of devices on the chosen semiconductor substrate. The isolated active region comprises a surface 203 and a P doped well in bulk semiconducting substrate 201. For the example N channel structure shown, the active substrate is the P-well 201. The FFT device structures are built up over the surface 203 of the active region of the substrate. Below the surface 203 is the P-well in the semiconductor substrate 201. The FFT device has three distinct regions on the surface 203 between the isolations 202A. The three regions are the gate region, the source region and the drain region. The gate region is defined by a gate dielectric 204 on the surface 203 of the active region. The gate region with the gate dielectric 204 separates the source and drain regions from each other, i.e., the source region is on one side of the gate region, and the drain region is on the opposite side of the gate region. The FFT gate structure comprises a conductive gate electrode 205. In the embodiment shown in FIG. 2A, the gate electrode 205 is shown as a single conductive gate material 205B, whereas the gate electrode 205 shown in the metal gate implementation of FFT in FIG. 2B, in an embodiment, comprises the conductive gate material 205B on top of metal gate material 205A (which may be optional in an embodiment). The metal gate material may be chosen to have a work function that creates a desired threshold voltage for the transistor. The gate electrode in either implementation overlies the gate dielectric 204, enabling the formation of a conductive channel under the gate dielectric 204 of the gate structure by application of an appropriate voltage on the conductive gate electrode 205 in the FFT implementations shown in FIG. 2A and FIG. 2B. The channel conductance is controllable by the threshold for channel formation established for the FFT and the magnitude of the applied voltage on the gate electrode, as is well understood in the industry. The application of the gate voltage to the conductive gate electrode 205 over the gate dielectric 204 is made via a contact plug 214 through a protective interlayer dielectric 212. The contact plug 214 can be connected to the gate electrode via silicided contact region 211B (which may be optional in an embodiment) as shown in FIG. 2A and FIG. 2B. The gate electrode, in this embodiment, is shown as connected to a first metallization 214B over the first protective dielectric 212 through the plug 214 and the silicided contact 211B. The connections to any specific metallization layer shown are only examples and should not be considered limiting as is well understood in the industry.

An FFT source is formed on the surface of the source region. The FFT source comprises an epitaxially deposited source extension 207A on silicon surface of the source region; the source extension 207A is insulated from the gate electrode 205 by a first dielectric 206A. A second source epitaxial deposition 208A is deposited over the source extension 207A; the source epitaxial deposition 208A is isolated from the gate electrode 205, by a second dielectric 206B that is thicker than the first dielectric 206A. Though shown as a single dielectric layer, the second dielectric 206B may comprise a one or more additional dielectric layers deposited over the first dielectric 206A. The epitaxial source extension 207A and the epitaxial source 208A together form the source of the FFT. A conductive connection to the source is through a Via that includes a contact plug 215 and a silicide layer (which may be optional in an embodiment) on the source 211C. The contact plug may extend through one or more insulating dielectric layers 212 and 218 based on the circuit consideration that defines the connectivity of the source to a first interconnect metallization, second interconnect metallization, or other interconnect metallization as is well understood in the industry. In FIG. 2A and FIG. 2B, the source is connected to first interconnect metallization 215B. As indicated previously, the contact plug connects the metallization 215B to silicided region 211C (which may be optional in an embodiment) of the epitaxial source layer 208A; this provides the source contact to the FFT.

Similarly, an epitaxial drain extension 207B is formed on the surface of the substrate 203 on the opposite side of the gate dielectric 204 but isolated from the conductive gate electrode 205 by the first protective dielectric 206A, and an epitaxial drain 208B is deposited on the drain extension 207B, insulated from the gate electrode 205 by the dielectric 206B. The epitaxial layers 207B and 208B together form the drain of the FFT. The drain is contacted by a via with the conductive contact plug 213 as shown in FIG. 2A and FIG. 2B connecting to conductive metal silicide layer 211A (which may be optional in an embodiment) on the conductive drain epitaxial layer 208B. The contact plug within the via may extend through one or more insulating dielectric layers 212 and 218 based on the circuit consideration that defines the connectivity of the source to a first interconnect metallization, second interconnect metallization, or other interconnect metallization as is well understood in the industry. The drain of the FFT is shown in FIG. 2A and FIG. 2B as being connected to a second interconnect metallization 213B via the conductive plug and the silicide.

The silicided contacts 211A, 211B, and 211C are used to reduce the contact resistance of the drain electrode 208B, Gate electrode 205 and Source electrode 208A respectively.

Metal 1, or first interconnect metallization layers 214B and 215B running over dielectric layer 212 are shown over the vias 214 and 215, for interconnection of source and gate electrodes, while a stacked via 213 through dielectric 212 and first intermetal dielectric 218 is shown connecting to the drain of the FFT to a second interconnect metallization 213B in FIG. 2A and FIG. 2B. The use of the silicided contacts, the interconnect metallization and use of a stacked via are example representations only and not intended to create any limitations to the underlying structure of the FFT.

In various embodiments, the FFT device has multiple advantages over prior art planar transistor structures for gate dimensions at or below 28 nm which will improve the characteristics of the integrated FFT-DRAM using the FFT pass device. These advantages, in addition to the ability to be integrated in an IC or SOC with lower cost of implementation of FFT, are mainly derived from the structure and process of FFT device. The FFT device is structurally built on top of the substrate surface 203. The source extension 207A and drain extension 207B, forming the bottom surfaces of the doped source and doped drain of the FFT, are epitaxially formed on the substrate surface 203 of the FFT device, and they are essentially co-planar with the gate oxide 204 providing for an electric field that is almost uniformly distributed or flat across the plane of the of the gate and the channel. Further, the source extension 207A, the drain extension 207B, the source 208A and the drain 208B of the FFT are all built up over the surface of silicon using low temperature epitaxial growth. This process avoids implants and diffusions with their high temperature requirements. The low temperature processing limits spreading of dopants into the substrate, especially in the vicinity of the gate. This in turn reduces the impact of random dopant distributions and the associated Vt variance, allowing FFT devices to be designed for low supply voltage values, ranging from 0.3 to 2.0 volts for 28 nm devices. The lack of dopants diffused into the silicon surface 203 also reduces the impact of short channel effects; this allows improved gate control of leakage currents in the OFF condition and high device currents in the ON condition. Hence the advantages of using FFT as pass device are:

1. Low Vt variability.
 2. Improved control of channel by the gate voltage.
 3. Low supply voltage operation.
 4. Reduced short channel effects.
 5. Low leakage in OFF condition.
 6. High ON channel current.

These characteristics of the FFT device play important roles in the functionality of the integrated FFT-DRAM. The structural embodiments of the FFT-DRAM, with single type conductive gate electrode implementation 300A and a metal gate electrode implementation 300B are shown in FIG. 3A and FIG. 3B respectively. FIG. 3C shows an enhanced integrated storage capacitance implementation 300C.

Since the FFT-DRAM embodiments described in FIG. 3A, and FIG. 3B are structurally similar, the embodiment with metal gate FFT pass device shown in FIG. 3B will be used to describe the FFT-DRAM 300B for brevity sake.

Note that the doped epitaxial source 207A and 208A combination provides a structure for hosting a capacitor storage device (e.g., device 102 in FIG. 1) required to realize a DRAM cell. This capacitor is shown as trenched capacitor in FIG. 3B. The capacitor is formed of one or more of trenches or holes filled with a conductive material 310, which is isolated from the surrounding source epitaxial material 207A and 208A by a dielectric layer 309. In an embodiment, dielectric 309 possesses a high dielectric constant (High-k) to provide high capacitance value per unit area of the capacitor for charge storage. FIGS. 3A and 3B both show multiple etched trenches, or alternatively holes, in the source epitaxial layers 207A, 208A of the FFT-DRAM, each lined with the dielectric 309 and filled with conductive material 310. The choice of using trenches or holes depends on the capabilities in the fab for trench or hole formation, trench or hole dielectric insulation and refill capability, and also on the need for achieving maximum capacitance value in the limited space available in the source of the FFT-DRAM device. Further, while FIG. 3A and FIG. 3B show the capacitor electrodes 310 extending into the source extension regions 207A, this structure may only penetrate the source region 208A; that limitation may be imposed by manufacturing considerations. The filled trenches or holes 310 (hence forth both being designated by the term trench) are dielectrically isolated by the side wall and bottom dielectric 309 from the surrounding epitaxial regions 207A and 208A, which form the epitaxial source of the FFT-DRAM 300A or 300B on a silicon substrate as shown in FIG. 3A and FIG. 3B. It is clearly understood that the trench sidewalls and the bottom of the trench all have the isolation dielectric 309. The conductive material 310 within the trench is grounded or connected to a fixed potential. In the embodiments shown in FIG. 3A and FIG. 3B, the conductive material 310 within the trench is connected to the first interconnect metallization 215B shown as interconnect 103 in FIG. 1A, via the silicide, TiN or other etch protective layer 211D and the metallic contact plug 215A. The conductive material 310 filling the trench may comprise polysilicon, amorphous silicon or any other conductive metal or metallic compound suitable for low temperature trench filling, as is well understood in the industry. The FFT pass transistor 101B of the FFT-DRAM has a gate electrode comprising the gate conductor 205, which may comprise the conductive gate material 205B over the metallic gate material 205A over the gate dielectric 204 on the substrate surface 203. The gate electrode structure is enabled to form a conductive channel under the gate dielectric 204, in the silicon underlying surface 203 upon application of an appropriate gate voltage via the gate conductor 205. The gate electrode may be formed by a "gate first" process as indicated in the current application or by a "gate last" process that is also well understood in the industry. The gate conductive structure 205, whether an amorphous gate or metal gate, has, on either side of it, an epitaxial source extension 207A and an epitaxial drain extension 207B on the substrate surface. The gate conductor 205 is isolated from the source and drain extensions 207A and 208B by a dielectric insulator 206A surrounding the gate conductor 205. A source epitaxial layer 208A is deposited on top of the source extension 207A; together these two layers form the source of the FFT-DRAM. A drain epitaxial layer 208B is deposited on top of the drain extension 207B; together these two layers form the drain of the FFT-DRAM shown in either FIG. 3A or FIG. 3B.

Comparing FIG. 3A and FIG. 3B to the schematic in FIG. 1B, it can be seen in FIG. 1B that three elements of the FFT DRAM, one terminal of the capacitor 102B connected to ground 103B, the gate of the FFT 101B connected to the word line 104B and the drain of the FFT 101B connected to the bit line 105B, are all connected typically by interconnect metallization. It should be noted that the grounded terminal of capacitor 102B connects to a ground line 103B while the other terminal of the capacitor forms an integral part of the source of the FFT pass transistor in the integrated FFT-DRAM of FIG. 3A and FIG. 3B. In FIG. 3A and FIG. 3B, connections to the interconnect metallization are made by conductive material 215A deposited as a conductive plug in a contact or via etched through the interlayer dielectric 212B; this connects layer 211D and the capacitor electrode 310 to the metal layer 215B which is connected to the ground or to an advantageous fixed voltage. In FIG. 3A and FIG. 3B gate of the pass device FFT is connected to the word line 104 or 214B by conductive material 214 deposited in vias etched in the two interlayer dielectrics 212A and 212B; this connects the silicide layer 211B and the gate 205 to the metal 214B. Finally, the drain of the FFT is connected to the bit line 105B of FIG. 1 using a conductor 213 deposited in vias through the first interlayer dielectric 212A, the second interlayer dielectric 212B and the intermetal dielectric 218; this connects the silicide 211A and the drain 208B to the bit-line metal 213B. Standard industry practice is to use chemical vapor deposited tungsten as the conductive via filling and copper as the interconnect metallization, which should not be considered limiting the use of other via fills and interconnect metalization schemes used in practice.

The FFT transistor structure of FIGS. 2A and 2B and the FFT-DRAM structure of FIGS. 3A and 3B are built above the surface 203 of the silicon substrate. This means that the structures may be used on a variety of substrate types. FIGS. 2A, 2B, 3A, and 3B show bulk substrates with trench isolation. Typically, shallow trench isolation is used is these embodiments. The described FFT-DRAM structures in FIGS. 3A and 3B are applicable to a variety of substrates, depending upon considerations of cost and performance. For instance, the use of an epitaxial layer on the silicon surface, or the use of an SOI wafer having an epitaxial surface layer, may offer advantages insofar as a defect-free epitaxial layer in which the transistor channel is established; this will further reduce the leakage across the FFT source and drain.

It should be noted that, by using epitaxial material with a low defect density as a surface layer wherein the channel is formed in that epitaxial layer on the base wafer or SOI wafer will result in lower leakage than when using a non-epi channel region on the substrate. Reduced leakage will increase the time required between data refresh cycles in the FFT-DRAM cells.

FIGS. 3A and 3B represent an embodiment of the FFT-DRAM, but other embodiments may involve deviations from these drawings. For instance, the source 207A, 208A and drain 207B, 208B regions have approximately the same extents from the gate region 204. In order to establish sufficient storage capacitance 102, it is possible that the source region 207A/208A may be expanded. As is common in DRAM designs, the Word Lines 104 are perpendicular to the Bit Lines 105. In FIG. 3A and FIG. 3B, the Word Line is indicated by region 214B, and it is perpendicular to the plane of the drawings. In those same figures, the Bit Line is represented by 213B, and it runs parallel to the plane of the drawings.

In order to maximize the bits per unit area, certain features of the FFT-DRAM may be shared. For instance, the drains 207B and 208B of bits in adjacent rows may be shared, along with their common contact 213 and metal 213B. Similarly, a "ground" line 215B may be shared between adjacent bits in a case where the memory layout positions bits with their drains 207B, 208B shared and sources 207A, 208A close to each other in adjacent rows. Layouts are subject to the limitations of the lithography and patterning at any particular technology node. Hence sharing of terminal or terminals of the FFT-DRAM should not be considered a reason to differentiate the integrated FFT-DRAM device structure disclosed.

The FFT-DRAM implementation is an integrated addition of the storage capacitor process to the FFT process flow. The FFT-DRAM, by integrating the storage capacitor with the FFT pass transistor, has the following technical advantages:

1. The trench capacitors, since they are formed through high doped epitaxial silicon provide for very high per unit capacitance value than the typical trench capacitors formed in low doped wells of the prior art.
2. The low threshold of the FFT pass device allows lower operating voltages to be used to store and read data in the FFT-DRAM.
3. Low leakage across the FFT pass transistor and low recombination in the epitaxial layers surrounding the capacitive storage device enable the charge in the storage capacitors to last longer, extending the time to refresh of the FFT-DRAM.
4. High charge/discharge current enables high-speed FFT-DRAM application.
5. The ease of integration of the FFT-DRAM with the peripheral logic devices and the read/write logic using FFT in the stand alone standard FFT-DRAM result in a low voltage, high-speed and lower cost FFT-DRAM memory.
6. The low voltage operation capability of the FFT-DRAM devices reduces power dissipation of the FFT-DRAM memory arrays implemented.
7. The lower leakage of the FFT pass devices resulting in longer time between refresh of the FFT-DRAMs further reduces the power dissipation of the stand-alone and embedded FFT-DRAM arrays.
8. The easy integration of the FFT-DRAM process flow with the logic circuits using FFT lowers the cost of integrated implementation of FFT-DRAM in the designed IoT circuits.

FIG. 4 shows a Table 1 of a process to fabricate a "gate first" FFT transistor structure with a metal gate as shown in FIG. 2B. This FIG. 4 provides a basis for comparing the process flow for the FFT to the process flow of the FFT-DRAM structure of FIG. 3B. The process flow of the FFT-DRAM is shown in Table 2, FIG. 5. Both tables refer to a "gate first" class of process with metal gate implementation, and the discussion below will refer to the process flow of the FFT-DRAM shown in Table 2, FIG. 5.

As discussed above, the FFT-DRAM process may be executed on a variety of substrates, ranging from bulk to fully depleted silicon-on-insulator FDSOI substrates. Shallow trench isolation, as cited in Seq. 2, is the standard industry practice. The well regions in Seq. 2 will be designed to have their potentials referred to ground or another relatively negative voltage for NMOS or referred to the local supply voltage or another relatively positive voltage for PMOS, again within standard industry practice. The FFT-DRAM cell depicted in FIG. 3B uses an NMOS FFT device as an access transistor; that means that a p-type well will be connected to ground or to a potential that is negative with respect to the supply voltage. While using an NMOS FFT as an access device is typical, aspects of the disclosure are not to be considered limiting to FFT-DRAM using NMOS FFT only, but they also apply to an FFT-DRAM cell using a PMOS FFT as its access device.

The next processes step, at Seq. 3, create a gate dielectric 204, either by thermal oxidation of the underlying substrate and/or by deposition of an alternative dielectric, typically to realize a favorable combination of capacitance and breakdown voltage. Alternative dielectrics include a variety of Hi-K dielectric material and composite materials, of which nitrided-hafnium-silicates are examples. Gate dielectric thicknesses, for example, may range from 1 to 5 nm. In Seq. 4, a metallic layer of the metal gate is deposited over the gate dielectric. While this may be optional, the work function of a metallic element or compound can be used to define and optimize the threshold voltage of the FFT device, especially as gate lengths become small and supply voltages need to be reduced. This is a common practice for all configurations of advanced CMOS transistors, not just FFT. As part of the transistor design, the p-well/channel doping, the gate dielectric characteristics and the gate metal work function work together to define the threshold voltage of the transistor.

The gate structure is completed in Seq. 5 with the deposition of a layer of amorphous semiconductor or conductive material, typically amorphous silicon, doped to provide the conductivity necessary to deliver the drive voltages applied to the gate conductor 205 to the gate for forming the channel and modulating its conductance. The stack comprising the gate dielectric 204, gate metal 205A and gate amorphous conductor 205B is etched to define the spacing between the transistor source and drain. In an embodiment, the etched gate dielectric 204, and gate conductor 205 form the gate structures of the FFT and the FFT-DRAM shown in FIG. 2B and FIG. 3B.

After the gate structures have been defined, the sidewalls of the gate are insulated, at Seq. 6, with a dielectric 206A that is similar in thickness to the gate dielectric, e.g., 1 to 7 nm, and capable of withstanding the highest voltages applied to the transistor. Since the sidewall dielectric deposition is generally conformal, the FFT fabrication requires that the dielectric be selectively removed from the substrate, per Seq. 7. This will typically be accomplished using anisotropic reactive ion etching.

The first step in the source/drain formation is selectively growing a doped epitaxial layer 207A/207B on the bare substrate Source/Drain regions. This epitaxial layer forms the source and drain extensions. The selectively grown epitaxial layer is doped N-type for the NMOS devices and doped P-type for the PMOS devices. Typical doping densities, for example, may lie in the range of $5\times10^{18}$ ions per cm$^3$ to $5\times10^{20}$ ions per cm$^3$, and the epitaxial growth is executed at a temperature that does not cause diffusion of dopants into the substrate surface 203. For example, temperatures below 650° C. can be used for this epitaxial growth process. These grown epitaxial layers are relatively thin, having a thickness, for example, in the range of 3 nm to 20 nm. This thinness of the source/drain extension layer helps to manage the gate-to-source and gate-to-drain parasitic capacitances of the FFT device.

At Seq. 9, a dielectric, frequently $Si_3N_4$, is conformally deposited to a thickness in the general range of 10 nm to 100 nm, for example, and this dielectric is anisotropically etched to clear this deposition from the top of epitaxial extensions 207A and 207B, while leaving a thick sidewall dielectric 206B, in Seq. 10. The transistor structures are completed, in Seq. 11, by the low temperature selective epitaxial growth of thicker, more highly doped layers 208A and 208B. The source of the transistor structure is formed by the combination of highly doped source epitaxial layer 208A over the source extension 207A layer, and the drain of the transistor structure is formed by the highly doped drain epitaxial layer 208B over the drain extension 207B layer. These layers are more heavily doped than the extension layers 207A and 207B; typical values can lie in the range of $1\times10^{19}$ doping ions per cm$^3$ to $7\times10^{21}$/cm$^3$, for example, and the selective epitaxial growth is executed at a low temperature, e.g., at less than 650° C., that does not cause any substantial thermal diffusion of dopants into the substrate surface 203. The thickness of this layer 208A/208B is defined in the design for the FFT-DRAM capacitors.

At this point, the DRAM process sequence departs from the general FFT transistor processing. The steps in Seq. 12 provide for deposition of a thin dielectric layer as a first part 212A of the interlayer dielectric (ILD-Part 1). This layer is deposited, and then planarized by chemical mechanical polishing CMP to form a base for a hard mask. A hard mask is deposited, typically using a metal layer over dielectric 212A, and the hard mask is used for etching controlled trenches or cylindrical pits in the source (layers 208A and 207A) that form the source) of the FFT-DRAM at Seq. 13. These trenches typically form the basic structure of the charge storage device of the FFT-DRAM. Other surface-area-increasing structures, such as "fins or posts" may be considered, in order to form the charge storage device/ capacitor of the FFT-DRAM instead of the trenches. The intention is to embed capacitors (for example, of 5 fF to 25 fF) within, below or over the epitaxial source of the FFT-DRAM.

The next step in capacitor formation is Seq. 14, the deposition of a dielectric layer 309 within the area-enhancing structures, the trenches or pits in the source of the FFT-DRAM. The composition and thickness of this dielectric 309 are key determinants of the capacitance value, which should be high, and its leakage, which should be low. The thickness of this dielectric 309 typically ranges between 1 nm and 7 nm, as an example. The structure of the charge storage capacitors is completed at Seq. 15, with the deposition of a conductive material 310 into the dielectric-lined holes or trenches as a second terminal of the capacitor. This conductive material is typically doped amorphous silicon, although other conductive materials, like tungsten, may also be used. These conductive materials must be capable of conformally filling the holes, trenches or other capacitance enhancing geometries. The excess material filling the trench overlaying ILD-Part 1 212A is removed using CMP, or a mask and etch-back at Seq. 16. An etch blocking metal layer 211D, composed of masked and residual amorphous silicon or alternately a deposited and masked titanium nitride (TiN) layer, is used to protect the filled trenches 310 and inter trench dielectric insulation 309 of the filled trenches at Seq. 17. A second dielectric deposition 212B (ILD-Part 2) is done over ILD-Part 1 212A to form the composite ILD 212. The last ILD, 212B, is planarized using CMP to complete the ILD process at Seq. 18.

The process elements Seq. 12 to Seq. 18 are unique to the FFT DRAM processing. Processing from Seq. 19 forward is common to the FFT logic transistors and FFT-DRAM. As described, the composite inter-layer dielectric, comprising 212A and 212B, is built up by depositing a second dielectric layer 212B over the first dielectric hard mask base layer 212A.

At Seq. 19, contacts are formed. The contact process consists, for example, of photolithography and etching the dielectric. The contact etch process is selected to have high selectivity to silicon and the protective layer over the trench capacitor which act as etch stops on the silicon of the gate electrode, on the drain of the FFT-DRAM, and on the protective layer of the filled trench. This may be followed by optionally depositing, or forming, a silicide contact within the etched contacts. This may be done by depositing and sintering a silicide material or by using silicon reacted with Ti, Ni, or Cr to form self-aligned silicide layers 211A, 211B and 211D, which enhance contact conductance. The silicide formation is followed by contact filling with a CVD metal, usually tungsten, and CMP to clear the glass surface. This sequence creates the contact plugs 213, 214 and 215A connecting to the drain, gate and capacitor terminals of the FFT-DRAM, respectively.

Once the contacts have been formed, the next step is metallization. At this point, there are two distinct paths, patterned metal or Damascene metal. In either case, FFT-DRAM interconnection requires two different layers of interconnect metal. In the representative figures, the first metal 214B supports Word Line access to the FFT pass transistors, and first metal 215B supports the ground or fixed voltage connection to the storage capacitors. The second metal 213B supports the Bit Line access to the memory cells. An intermetal dielectric 218 separates the first metal layers 214B and 215B from the second metal layer 213B. The Bit Lines are normally perpendicular to the Word Lines. All metallization and related dielectric steps are assumed to be done according to standard industry practices. Alternative interconnect sequences may used without violating the essential elements of this DRAM cel design.

As shown, the FFT-DRAM can be implemented by adding a few dedicated steps to the underlying FFT process flow in Table 1. The additional steps are bold faced in Table 2. The steps shown are only an example and may vary according to the processing resources and capabilities at the manufacturing fab. The additional steps are all standard steps for which the capability and process knowledge exist in most if not all semiconductor fabs running the advanced technology nodes at or below 30 nm.

Further, Table 1 and Table 2 are based on the use of Gate First transistor processing. Similar advantages can be applied to Gate Last processing.

As is well understood in the industry, implementation and integration of FFT-DRAM into the FFT based SOC for IoT applications will make the technology cost effective and applicable in the field. Though the FFT-DRAM structure is shown with trenches or holes that are within the epitaxial source region, the trenches can also be extended into the substrate to increase the capacitance of the storage capacitor with a sidewall doping to match the source doping type. Forming such a conductive doped layer, which connects to the source, surrounds the exterior of the capacitor dielectric layer, and reaches into the well in the substrate, can typically be achieved using low temperature gas doping, prior to deposition or growth of the capacitor dielectric layer/film within the trench on the sidewalls. The example structure of this device is shown in FIG. 3C. In FIG. 3C, the trench structure is extended into the well below the surface of the substrate with conductive fill 310 which is isolated by the sidewall dielectric from the doped region 311 in the well immediately surrounding the trench sidewall. The doped region 311 is the region surrounding the trench, which has been etched into the well that has a doping impurity opposite that of the source of the FFT-DRAM, and the region 311 is doped with the same type of impurity as the source and connected to the source, forming the first terminal of the charge storage capacitor. This will add an additional step of sidewall doping after trench capacitor formation, but it will help increase the capacitance value of the storage capacitor. Also, there are other possibilities for implementing the storage device such as a Fin Capacitor made up of multiple layers of metal or poly separated by dielectric, that are well understood in the industry. These can be used to construct alternate charge storage capacitors or as a combination with the trench capacitor to increase the value of the storage capacitor. When using the Fin Capacitor for the FFT-DRAM, it can be built up over the source of the FFT with one terminal connected to ground and the other to the source of the FFT as with the trench capacitor. Like the Fin Capacitor, there may be other capacitor structures that are known in the industry. Such structures may be integrated with the FFT using appropriate process steps to form an FFT-DRAM. These FFT-DRAM structures with alternate capacitor structures are covered by the disclosure in the current application.

The FFT technology with the integrated FFT-DRAM implemented thereon also provide the following additional advantages to the designers of IoT devices and the market.
1. Integrated FFT-DRAM allow the FFT-DRAM array to be optimized for the required number of calls and interconnect configurations.
2. The integrated FFT-DRAM allow the flexibility to the designer to place the FFT-DRAM arrays to be appropriately sized, configured and placed at appropriate locations within an IC/SOC to satisfy needs of the design.
3. Lower cost of manufacturing and integration allow IoT devices and stand-alone DRAMs manufactured with FFT-DRAM device technology integrated with FFT logic circuits to be cost competitive for commercial applications.
4. The reduction in operating voltage of the FFTs and the increased time between refresh cycles for the FFT-DRAMs reduce power dissipation of the systems using the disclosed technology.

While the disclosure has been described in terms of embodiments, those of ordinary skill in the art will recognize that the disclosure is not limited to the embodiments described, but it can be practiced with modifications and alterations within the spirit and scope of the appended claims. The description is thus to be regarded as illustrative instead of limiting. There are numerous other variations to different aspects of the disclosure described above, which in the interest of conciseness have not been provided in detail. Accordingly, other embodiments are within the scope of the claims.

What is claimed is:

1. A dynamic random-access memory (DRAM) cell, comprising:
   an epitaxially grown source having a doping of a second type, the epitaxially grown source over and in contact with a source region of a surface of a semiconductor substrate, the semiconductor substrate having a doping of a first type opposite to the second type, forming a junction at an interface between the source region of the surface of the semiconductor substrate and the epitaxially grown source;
   an epitaxially grown drain having a doping of the second type, the epitaxially grown drain over and in contact with a drain region of the surface of the semiconductor substrate, the semiconductor substrate having a doping of the first type opposite to the second type, forming a junction at an interface between the drain region of the surface of the semiconductor substrate and the epitaxially grown drain;
   a gate structure on the surface of the substrate, separating the source region and the drain region of the surface of the semiconductor substrate, the gate structure having a gate dielectric separating a conductive gate electrode from the surface of the semiconductor substrate;
   a pass gate comprising the conductive gate electrode enabled to create a conductive channel in the semiconductor substrate under the gate dielectric, the conductive channel electrically connecting the epitaxially grown source over the source region and the epitaxially grown drain over the drain region when a gate voltage in excess of a threshold voltage of a pass transistor is applied to the conductive gate electrode;
   a capacitor structurally integrated into the epitaxially grown source, the capacitor having a first terminal connected to the epitaxially grown source and a second terminal connected to a ground terminal or a fixed voltage terminal; and
   a capacitor dielectric separating the first and second terminals of the capacitor;
   wherein
   when the pass transistor is turned on, the first terminal of the capacitor is electrically connected to a bit line connected to the epitaxially grown drain; and
   when the pass transistor is turned off, the first terminal of the capacitor is isolated from the bit line connected to the epitaxially grown drain.

2. The DRAM cell of claim 1, wherein the capacitor is a trench capacitor or a multi-fin capacitor.

3. The DRAM cell of claim 2 wherein
   the trench capacitor comprises one or more etched holes extending into the semiconductor substrate through the epitaxially grown source;
   a region adjacent to sidewalls of the etched holes having a doping of the second type, and thereby forming a connection between the region adjacent to the sidewalls of the etched holes and the epitaxially grown source;
   the epitaxially grown source forming a first terminal of the trench capacitor, the trench capacitor having a capacitor dielectric on the sidewalls of the etched holes; and
   a conductive material filling the etched holes to form a second terminal of the trench capacitor;
   wherein the first terminal and the second terminal of the trench capacitor are separated by the capacitor dielectric.

4. The DRAM cell of claim 1, wherein the semiconductor substrate is doped with a p-type dopant, and the epitaxially grown source and the epitaxially grown drain are doped with an n-type dopant, whereby the DRAM cell is an N-type DRAM cell.

5. The DRAM cell of claim 1, wherein, the epitaxially grown source and the epitaxially grown drain are doped with a p-type dopant, and the semiconductor substrate is doped with an n-type dopant, whereby the DRAM cell is a P-type DRAM cell.

6. The DRAM cell of claim 1, wherein
   the epitaxially grown source and the epitaxially grown drain are formed by multiple layers of low temperature epitaxial depositions, with each layer having a differing doping concentration to form the respective junctions at the interface between the source region of the surface of the semiconductor substrate and the epitaxially grown source, and the interface between the drain region of the surface of the semiconductor substrate and the epitaxially grown drain.

7. The DRAM cell of claim 1, wherein
   the epitaxially grown source and the epitaxially grown drain are grown using a process that eliminates diffusion of dopant from the epitaxially grown source and the epitaxially grown drain into the substrate or from the substrate into the epitaxially grown source and the epitaxially grown drain, thereby forming respective junctions at an interface between the source region of the surface of the semiconductor substrate and the epitaxially grown source, and an interface between the drain region of the surface of the semiconductor substrate and the epitaxially grown drain.

8. The DRAM cell of claim 1, wherein the semiconductor substrate is one of a silicon substrate, a silicon substrate with an epitaxial layer grown thereon, or a silicon-on-insulator (SOI) substrate.

9. A dynamic random-access memory (DRAM) device integratable with a silicon integrated circuit (IC), the DRAM device comprising:
- an epitaxial source having a doping of a second dopant type, the epitaxial source being over a first portion of a surface of a substrate, the substrate having a doping of a first dopant type, creating a junction at an interface between the epitaxial source and the substrate, the epitaxial source being connected structurally to a first terminal of a capacitor, the capacitor having a first conductive layer structurally connected to the epitaxial source forming the first terminal of the capacitor, a second terminal of the capacitor being formed by a second conductive layer separated from the first conductive layer by a capacitor dielectric layer, the second conductive layer being connected to a ground or a fixed voltage source via a metal interconnect;
- an epitaxial drain having a doping of the second dopant type, the epitaxial drain being over a second portion of the surface of the substrate, the substrate having a doping of the first dopant type, creating a junction at an interface between the epitaxial drain and the substrate, the epitaxial drain being connected to a bit line; and
- a pass gate being over the surface of the substrate between the epitaxial source and the epitaxial drain, the pass gate being configured to form a channel in the substrate connecting the epitaxial source and the epitaxial drain when a gate voltage in excess of a threshold voltage of a pass transistor of the DRAM device is applied to a gate electrode, the gate electrode connecting to a word line enabled to turn the pass transistor on or off by the application of the gate voltage.

10. The DRAM device of claim 9, wherein the capacitor is a trench capacitor or a multi-fin capacitor.

11. The DRAM device of claim 9, wherein when the pass transistor of the DRAM device is turned on to execute a READ operation, the first terminal of the capacitor is electrically connected to the bit line and a stored charge is shared between the capacitor and the bit line.

12. The DRAM device of claim 9, wherein when the pass transistor of the DRAM device is turned on to execute a WRITE operation, the first terminal of the capacitor is electrically connected to the bit line having a voltage representing either a ONE or a ZERO, and a charge is passed to or from the capacitor to establish a charge storage representing either a ONE or a ZERO in the capacitor.

13. The DRAM device of claim 9, wherein during a WRITE operation, the bit line is connected to a data input, the pass transistor of the DRAM device is turned on to charge or discharge the capacitor in response to the data input on the bit line, and the pass transistor of the DRAM device is turned off to isolate the capacitor from the bit line, causing the capacitor to retain a stored charge representing a data value of either a ONE or a ZERO.

14. The DRAM device of claim 9, wherein during a READ operation, the pass transistor of the DRAM device is turned on to enable the capacitor to connect to the bit line and share any stored charge in the capacitor with the bit line, with the bit line being sensed to identify a value of a stored data in the capacitor.

15. A dynamic random-access memory (DRAM) device, comprising:
- a gate having a conductive gate electrode positioned over a gate dielectric;
- a first portion of an epitaxial drain and a first portion of an epitaxial source on a surface of a substrate, the first portion of the epitaxial drain and the first portion of the epitaxial source formed over and in contact with respective source and drain regions of the surface of the substrate, the epitaxial drain and epitaxial source being isolated from the conductive gate electrode by a first dielectric, the epitaxial drain and epitaxial source forming respective junctions at their interfaces with the respective drain and source regions of the surface of the substrate; and
- a second portion of the epitaxial source over the first portion of the epitaxial source and a second portion of the epitaxial drain over the first portion of the epitaxial drain, the respective second portions of the epitaxial source and the epitaxial drain being isolated from the conductive gate electrode by a second dielectric;
- the epitaxial source, the epitaxial drain and the gate together forming a pass transistor enabled to connect the epitaxial source to the epitaxial drain when a voltage value in excess of a threshold value is applied to the conductive gate electrode;
- the source region having one or more charge storage capacitors, each charge storage capacitor having one of its terminals connected to the epitaxial source to store charge responsive to data being stored, the charge storage capacitor having first and second conductive electrodes separated by a capacitor dielectric, the first conductive electrode having its terminal coupled to the epitaxial source, the second conductive electrode being isolated from the epitaxial source and the first conductive electrode by the capacitor dielectric, and the second conductive electrode being connected to a ground terminal or a fixed voltage terminal;

wherein
- a channel of the pass transistor forms a path connecting the first terminal of the charge storage capacitor to a bit line connected to the epitaxial drain when a gate voltage in excess of a threshold voltage is applied to the conductive gate electrode to turn on the pass transistor; and
- the channel of the pass transistor is turned off, when the gate voltage is removed from the conductive gate electrode to isolate the terminal of the first conductive electrode of the charge storage capacitor from the bit line.

16. The DRAM device of claim 15 wherein stored charge in the charge storage capacitor is responsive to data input during a WRITE operation of the DRAM device.

17. The DRAM device of claim 15, wherein during a READ operation of the DRAM device, stored charge in the charge storage capacitor is shared with the bit line.

18. The DRAM device of claim 15, wherein the substrate is one of a silicon substrate, a silicon substrate with an epitaxial layer grown thereon, or a silicon-on-insulator (SOI) substrate.

19. The DRAM device of claim 15 wherein the charge storage capacitor is a multi-fin capacitor having a first terminal connected to the epitaxial source and a second terminal isolated from the first terminal by the capacitor dielectric, the second terminal is connected to the ground terminal or the fixed voltage terminal.

20. The DRAM device of claim 15, wherein the charge storage capacitor has a first terminal connected to the epitaxial source and a second terminal isolated from the first terminal by the capacitor dielectric, the second terminal is connected to the ground terminal or the fixed voltage terminal.

\* \* \* \* \*